United States Patent [19]

Kuhn

[11] Patent Number: 4,825,160

[45] Date of Patent: Apr. 25, 1989

[54] METHOD AND DEVICE FOR MR TOMOGRAPHY

[75] Inventor: Michael H. Kuhn, Hamburg, Fed. Rep. of Germany

[73] Assignee: U.S. Philips Corporation, New York, N.Y.

[21] Appl. No.: 141,803

[22] Filed: Jan. 11, 1988

[30] Foreign Application Priority Data

Jan. 23, 1987 [DE] Fed. Rep. of Germany ....... 3701849

[51] Int. Cl.$^4$ ............................................. G01R 33/20
[52] U.S. Cl. ..................................... 324/309; 324/307
[58] Field of Search ............... 324/300, 307, 309, 312, 324/313, 318, 322; 128/653

[56] References Cited

U.S. PATENT DOCUMENTS

| | | | |
|---|---|---|---|
| 4,470,014 | 9/1984 | Levitt et al. | 324/307 |
| 4,471,305 | 9/1984 | Crooks et al. | 324/309 |
| 4,714,081 | 12/1987 | Dumoulin et al. | 324/306 |
| 4,721,912 | 1/1988 | Kaufman et al. | 324/309 |

Primary Examiner—Michael J. Tokar
Attorney, Agent, or Firm—Jack E. Haken; Jack D. Slobod

[57] ABSTRACT

The known method of determining the longitudinal and possibly the transverse relaxation time requires comparatively long repetition times, resulting in comparatively long measurement times. In accordance with the invention, each sequence comprises at least two subsequences, each of which contains at least one r.f. pulse, the repetition times being different and so short that the longitudinal magnetization has not yet reached its original value when the next sub-sequence commences. The invention enables the formation of T1-weighted, and possibly T2-weighted, tomograms for notably medical diagnostics.

4 Claims, 3 Drawing Sheets

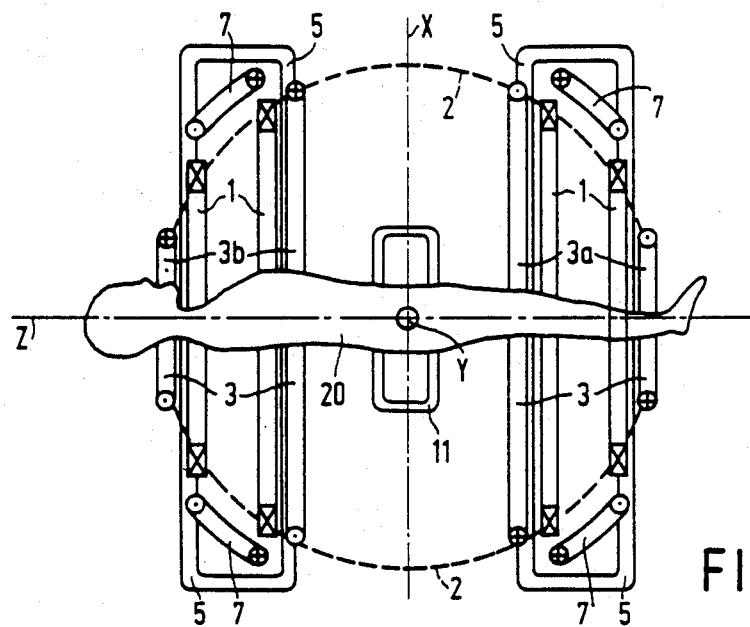
FIG.1
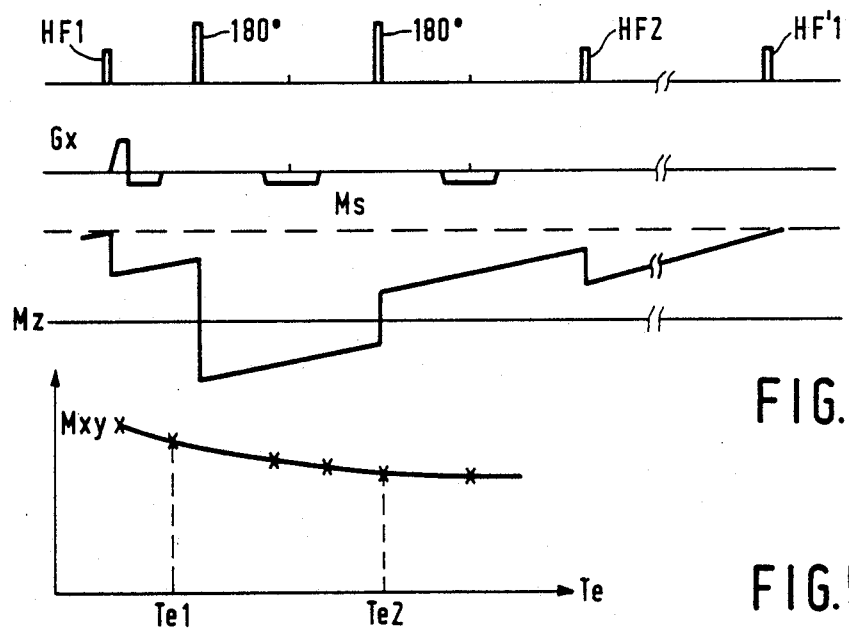
FIG.4
FIG.5

METHOD AND DEVICE FOR MR TOMOGRAPHY

The invention relates to a method for MR tomography where an examination zone is subjected in the presence of a uniform, steady magnetic field, to a plurality of sequences which include the generating of an r.f. pulse for rotating the nuclear magnetization through an angle which is smaller than 90°, the activation of magnetic gradient fields with gradients which can be varied as regards magnitude or direction from one sequence to another, and the detection of spin resonance signals during or after the application of the magnetic gradient fields.

A method of this kind is known from the magazine "Magnetic Resonance Imaging", Vol. 3, pages 297–299, 1985. The individual sequences thereof have such a short repetition time (being the distance in time between the first pulses of two successive sequences) that the longitudinal magnetization subsequent to a sequence has not yet regained its original state when the next sequence commences. Therefore, the actual magnetic resonance imaging examination is preceded by a series of sequences whose echo signals are not evaluated. After some of these sequences the longitudinal magnetization will have reached a steady state at the beginning of a sequence and the echo signals subsequently occurring can be used for forming a tomogram showing the spatial distribution of the nuclear magnetization in the examination zone. The flip angle, i.e. the angle wherethrough the nuclear magnetization is rotated with respect to the longitudinal direction, must be smaller than 90° if an optimum signal-to-noise ratio is to be obtained.

Due to the short repetition times, the echo signals required for calculating a tomogram by means of the known method can be derived within a comparatively short period of time. The tomogram thus formed, however, contains only a comparatively small amount of information concerning the so-called longitudinal relxation time T1. Knowing the spatial distribution of this relaxation time, however, is of essential importance for medical diagnostics.

Various methods are known for calculating the T1 relaxation time (see "Journ. Mag. Res." 65, pages 481–490). These methods, however, require long repetition times in the order of magnitude of 2 s, so that the measurement time for deriving the echo signals required for a high-resolution tomogram may be as long as 10 minutes.

It is the object of the invention to provide a method of the kind set forth which allows for the longitudinal relaxation time T1 to be determined, and also to provide a device for performing this method.

Thus, in accordance with the invention a sequence consists of at least two successive sub-sequences in which the spatial dependency of the nuclear magnetization on the frequency and/or phase is always the same as a result of the variation in time of the magnetic gradient fields, said sub-sequences having similar r.f. pulses but different repetition times.

If the repetition time were long in comparison with the longitudinal relaxation time of the tissue in the examination zone or if the relaxation times of the sub-sequences were equal, the longitudinal magnetization in a pixel (being in a finite part of the examination field) would always have the same value, at least in the steady state, when the r.f. pulse of the sub-sequence appears. The transverse magnetization after an r.f. pulse, causing the spin resonance signal, would thus also have the same value if similar r.f. pulses are used in the sub-sequence. Consequently, tomograms derived from the sub-sequences would be identical.

However, in accordance with the invention the repetition times are so short that the longitudinal magnetization has not yet reached its original value at the beginning of a sub-sequence and, moreover, the repetition times of the sub-sequences differ from one another. This means that at the beginning of the sub-sequence the longitudinal magnetization also has different values in the steady state. Consequently, the transverse magnetization produced in a pixel by the r.f. pulse of a subsequence also deviates from the transverse magnetization produced by an identical r.f. pulse of the other subsequences, i.e. the tomograms formed from sub-sequences having the same repetition time will differ. These differences are determined essentially by the variation in time of the longitudinal relaxation so that from these differences, i.e. from the values of the nuclear magnetization associated with a respective pixel in the different tomograms, there can be determined the longitudinal relaxation time, that is to say the time constant of the longitudinal relaxation.

A device for performing the method claimed in claim 1 which comprises means for generating a uniform steady magnetic field, means for generating r.f. pulses, means for generating at least one magnetic gradient field with a gradient whose magnitude or direction deviates from one sequence to another, a control unit for controlling the means for generating the r.f. pulses and the means for generating the magnetic gradient field, means for detecting spin resonance signals, and an arithmetic unit for generating tomograms from the spin resonance signals is characterized in that the control unit is constructed so that each time two sub-sequences which differ as regards their repetition time succeed one another, the arithmetic unit being programmed so that a tomogram is calculated each time from the echo signals of sub-sequences having the same repetition time, from the values of the nuclear magnetization for each time one pixel contained in the tomograms and from the associated repetition time there being determined the longitudinal relaxation time for the relevant pixel.

In a further version of the method in accordance with the invention, at least one of the sub-sequences includes two 180° pulses, from the spin echo signals produced thereby there being calculated further tomograms, the transverse relaxation time being determined from the different values of the nuclear magnetization of these tomograms and from the distance of the spin echo signals from the first r.f. pulse of the sub-sequence.

When the longitudinal relaxation time T1 and the transverse relaxation time T2 have thus been determined for each pixel, tomograms can be artificially formed, i.e. without subjecting the patient to another examination, which show the nuclear magnetization distribution for arbitrarily adjustable repetition times and echo times (being the distance in time between a resonance signal and an r.f. pulse).

The invention will be described in detail hereinafter with reference to the drawing; therein;

FIG. 1 shows an MRI tomography apparatus for performing the method in accordance with the invention.

FIG. 4 shows the variation in time of a subsequence modified for the additional determination of T2;

FIG. 5 shows the transverse magnetization as a function of T2.

Figure 2:
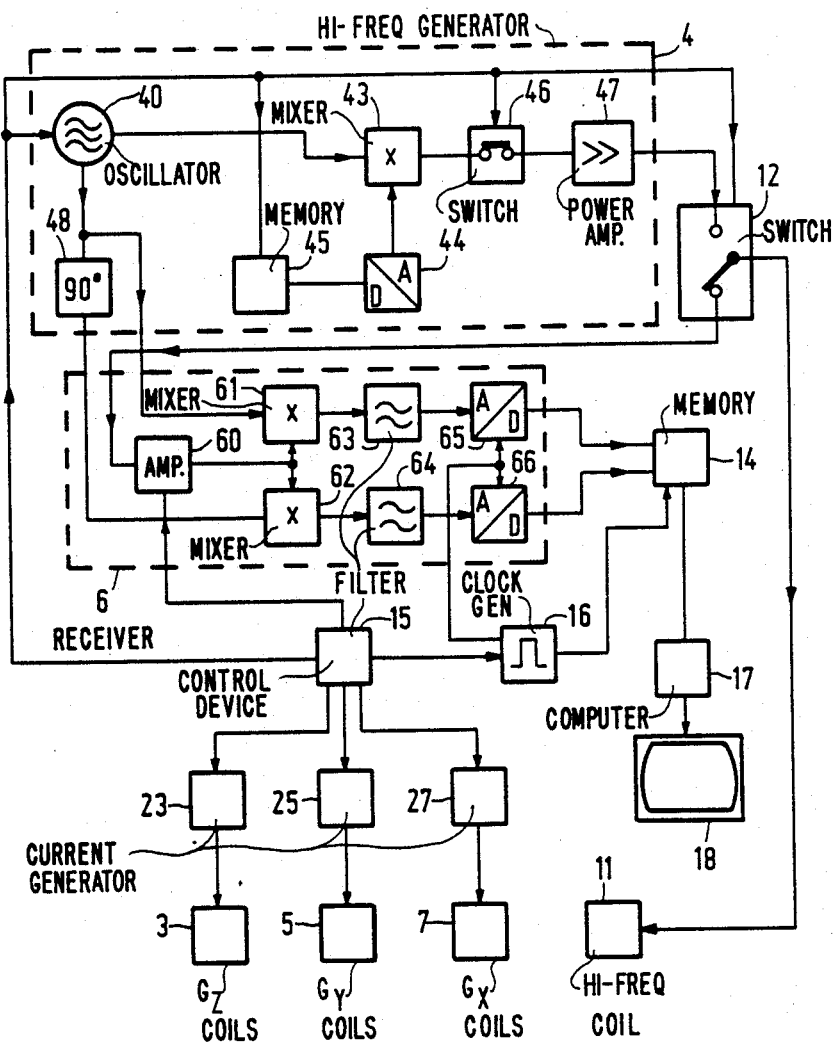
FIG. 2 shows a block diagram of such an apparatus.

The MRI tomography apparatus diagrammatically shown in FIG. 1 comprises an arrangement which consists of four coils 1 for generating a uniform, steady magnetic field whose intensity amounts to, for example 2 T. This field extends in the z-direction of a cartesian xyz coordinate system. The coils 1 are arranged so as to be concentric with the z-axis and may be provided on a spherical surface 2. The patient 20 to be examined is arranged inside the coils.

In order to generate a magnetic field Gz which extends in the z-direction and which linearly varies in this direction there are provided four coils 3, which are preferably arranged on the same spherical surface. There are also provided four coils 7 which generate a magnetic gradient field Gx which also extends in the z-direction (i.e. a magnetic field whose strength varies linearly in one direction) but whose gradient extends in the x-direction. A gradient field Gy which extends in the z-direction with a gradient in the y-direction is generated by four coils 5 which may have the same construction as the coils 7 but which are arranged so as to be rotated through 90° with respect thereto. Only two of these coils are shown in FIG. 1. Because each of the three coil systems 3, 5 and 7 for generating the magnetic gradient fields Gz, Gy and Gx is symmetrically arranged with respect to the spherical surface 2, the field strength in the centre of the sphere, at the same time being the origin of the cartesian coordinate system, is determined only by the steady, uniform magnetic field of the coil system 1.

Furthermore, an r.f. coil 11 is symmetrically arranged with respect to the plane z=0 of the coordinate system, which r.f. coil is constructed so that it generates an essentially uniform r.f. magnetic field which extends in the x-direction, i.e. perpendicularly to the direction of the steady, uniform magnetic field. The r.f. coil receives an r.f. modulated current from an r.f. generator during each r.f. pulse. Subsequent to each r.f. pulse, the r.f. coil 11 serves for the reception of spin resonance signals generated in the examination zone. However, use can alternatively be made of a separate r.f. receiver coil.

FIG. 2 shows a simplified block diagram of this MRI tomography apparatus. The r.f. coil 11 is connected, via a switching device 12, on the one side to an r.f. aparatus 4 and on the other side to an r.f. receiver 6.

The r.f. generator 4 comprises an r.f. oscillator 40 whose frequency can be digitally controlled and which produces oscillations having a frequency equal to the Larmor frequency of the nuclei to be excited at the field strength produced by the coils 1. As is known, the Larmor frequency f is calculated in accordance with the equation f=cB, where B is the magnetic induction in the steady uniform magnetic field and c is the gyromagnetic ratio which, for example for protons amounts to 42.56 MHz/T. The output of the oscillator 40 is connected to an input of a mixing stage 43. The mixing stage 43 receives a second input signal from a digital-to-analog converter 44 whose output is connected to a digital memory 45. Under the control of a control device 15, a series of digital data words which represent an envelope signal is read from the memory.

The mixing stage 43 processes the input signals applied thereto so that the carrier oscillation modulated with the envelope signal appears on its output. The output signal of the mixing stage 43 is applied, via a switch 46 which is controlled by the control device 15, to an r.f. power amplifier 47 whose output is connected to the switching device 12. The latter device is also controlled by the control device 15.

The receiver 6 comprises an r.f. amplifier 60 which is connected to the switching device and which receives the spin resonance signal induced in the r.f. coil 11; for this purpose the switching device should occupy the appropriate position. The amplifier 60 comprises a quenching input which is controlled by the control device 15 and via which it can be blocked, so that the gain is substantially zero. The output of the amplifier is connected to the first inputs of two multiplying mixing stages 61 and 62, each of which supplies an output signal which corresponds to the product of its input signals. The second inputs of the mixing stages 61 and 62 receive a signal having the frequency of the oscillator 40, a phase shift of 90° existing between the signals on the two inputs. This phase shift is produced by means of a 90° phase shifter 48 whose output is connected to the input of the mixing stage 62 and whose input is connected to the input of the mixing stage 61 and to the output of the oscillator 40.

The output signals of the mixing stages 61 and 62 are applied, via low-pass filters 63 and 64 which suppress the frequency supplied by the oscillator 40 as well as all frquencies higher than that frequency and which conduct lower frequency components, to a respective analog-to-digital converter 65, 66. The latter converts the analog signals of the circuit 61 ... 64, forming a quadrature demodulator, into digital data words which are applied to a memory 14. The analog-to-digital converters 65 and 66 as well as the memory receive their clock pulses from a clock pulse generator 16 which can be blocked and released, via a control lead, by the control unit 15, so that the signals supplied by the r.f. coil 11 and transposed to the l.f. frequency range can be converted into a series of digital data words for storage in the memory 14 only in a measurement interval which is defined by the control unit 15.

The data words or sampling values stored in the memory 14 are applied to an arithmetic device 17 which determines therefrom the spatial distribution of the nuclear magnetization in a layer of the examination zone and which outputs the distribution determined to a suitable display unit, for example a monitor 18. The three coil systems 3, 5 and 7 receive a current from current generators 23, 25 and 27, respectively, whose variation in time can be controlled by the control unit 15.

Figure 3:
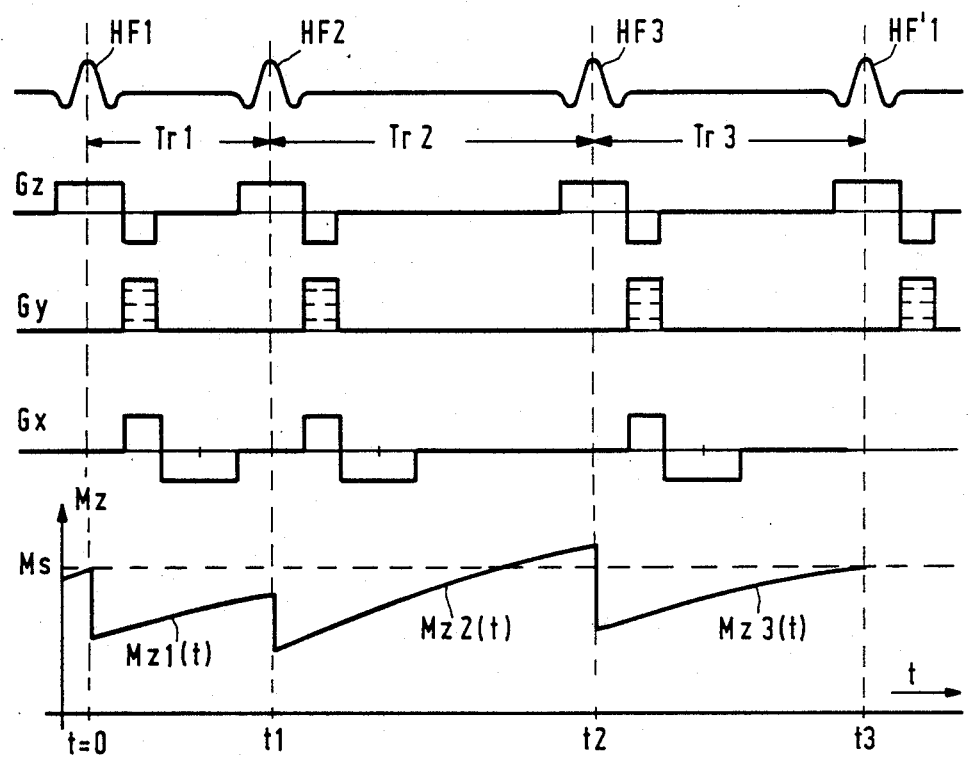
FIG. 3 shows the variation in time of a sequence for determining T1 and the longitudinal magnetization.

For a sequence consisting of three sub-sequences FIG. 3 shows the variation in time of the signals generated by the r.f. coil 11 and the gradient coils 3, 5 and 7 and also the variation in time of the longitudinal magnetization in a pixel.

The first line shows the position in time of the r.f. pulses. At the instant t=0 the r.f. pulse HF1 of the first sub-sequence is emitted. After the repetition time Tr1, i.e. at the instant t=t1, the r.f. pulse HF2 of the second sub-sequence is emitted. After expiration of the repetition time Tr2, i.e. at the instant t=t2, the r.f. pulse HF3 of the third sub-sequence is emitted. Finally, after the repetition time Tr3, i.e. at the instant t=t3, the r.f. pulse HF'1 is emitted which forms part of the first sub-sequence of the next sequence. The next and all further sequences again consist of three subsequences having the repetition times Tr1, Tr2 and Tr3. The variation in time of all r.f. pulses is identical, so that they can rotate the nuclear magnetization with respect to the longitudinal direction through each time the same angle. The variation in time and the power of the r.f. pulses are chosen so that this angle is larger than 0° and smaller than 90°. The repetition times Tr1, Tr2 and Tr3, however, differ.

The control device 15 controls the current generator 23 so that the gradient coil 3 generates a magnetic gradient field Gz during each of said r.f. pulses. After termination of the r.f. pulse the polarity of the magnetic gradient field Gz is reversed as appears from the second line of FIG. 3, after which the field is de-activated so that the time integral over this magnetic gradient field from the centre of the r.f. pulse until the instant of de-activation has exactly the value zero. It is thus achieved that the r.f. pulses thus excite the nuclear magnetization each time in the same layer of the examination zone.

The control device 15 controls the current generator 25 so that immediately after each r.f. pulse a magnetic gradient field Gy is generated and subsequently de-activated again (third line of FIG. 3). Control is performed so that the time integral over the magnetic gradient field after an r.f. pulse has the same value for all sub-sequences of a sequence. However, this value changes from one sequence to another.

Furthermore, the control device controls the current generator 27 so that the gradient coils 7 activate a magnetic gradient field Gx (see fourth line of FIG. 3) after each r.f. pulse, the polarity being subsequently reversed and the field de-activated when the time integral over Gx reaches a value which opposes and equals the value immediately before the reversal of this field. In the time interval between the reversal and the de-activation of the magnetic gradient field Gx the control device 15 releases the clock pulse generator so that the spin resonance signals supplied by the r.f. coil and transposed to the l.f. range (in this caes so-called gradient echoes) are converted into a series of digital data words for storage in the memory 14.

The variation in time of the magnetic gradient fields Gx, Gy and Gz is well known in two-dimensional Fourier imaging. However, alternatively a different variation in time may be chosen, for example in accordance with the projection reconstruction method. It is only important that the spatial distribution of frequency and/or phase is the same for the sub-sequences forming part of a sequence, but changes from one sequence to another. Alternatively, the variations in time of the gradient fields Gx, Gy and Gz can be interchanged so that, for example a layer extending perpendicularly to the y-axis or the x-axis is obtained instead of a layer extending perpendicularly to the z-axis.

The sequence which is shown in FIG. 3 and which comprises three sub-sequences is repeated a number of times, only the phase encoding gradient Gy being changed from one sequence to another. The sampling values of the echo signals stored in the memory 14 are combined by the arithmetic device 17 so that the sampling values obtained in subsequences having the same repetition time are processed together, a respective tomogram being derived therefrom in known manner, said tomogram containing the spatial distribution of the components of the nuclear magnetization perpendicularly to the direction of the steady magnetic field.

The fifth line of FIG. 3 shows the variation in time of the component Mz of the nuclear magnetization which extends in the direction of the steady magnetic field and which is often referred to as the longitudinal magnetization. As has already been stated, the actual examination is preceded by a number of sequences until a steady state is reached. Despite this steady state, the longitudinal magnetizations deviate from one another at the beginning of the various sub-sequences, because the repetition times Tr1, Tr2, Tr3 deviate.

Immediately before the start of the r.f. pulse HF1 of the first sub-sequence the longitudinal magnetizaton has the value Ms. The first r.f. pulse HF1 rotates the nuclear magnetization with respect to the direction of the steady magnetic field, i.e. the z-direction, through the angle $\beta$. Thus, immediately after the r.f. pulse HF1 a magnetization component Mxy extending perpendicularly to the z-axis is present in the relevant pixel, for which:

$$Mxy = M_s \sin\beta \tag{1}$$

The value determined for the relevant pixel in the tomogram from the first sub-sequences corresponds to this value Mxy.

Therefore, immediately after the first r.f. pulse HF1a longitudinal magnetization.

$$Mz = M_s \cos\beta \tag{2}$$

remains.

This longitudinal magnetization subsequently relaxes in the direction of the original magnetization $M_o$ ($M_o$ is the value of the longitudinal magnetization obtained either prior to the beginning of the r.f. excitation or sufficiently long after the end of the r.f. excitation) in accordance with the relation:

$$Mz1(t) = M_s(\cos\beta + (M_o/M_s - \cos\beta)(1 - e^{-t/T1})) \tag{3}$$

The variation of Mz1(t) in time is shown in FIG. 3 immediately before the occurrence of the r.f. pulse HF2, i.e. approximately at the instant t=t1, the longitudinal magnetization has the value M2, so that the following relation holds:

$$M2 = Mz1(t = Tr1) \tag{4}$$

After the r.f. pulse HF2, the transverse magnetization and the longitudinal magnetization $$Mxy = M2\sin\beta \tag{5}$$

and the longitudinal magnetization
$$Mz = M2 \cos\beta \tag{6}$$

are obtained.

The longitudinal magnetization subsequently relaxes to the value $M_o$ again with a time constant which corresponds to the longitudinal relaxation time T1, so that the following relation holds:

$$Mz2(t) = M2(\cos\beta + M_o/M2 - \cos\beta)(1 - e^{-t/T1})) \tag{7}$$

Upon occurrence of the second r.f. pulse HF2, t has the value zero. The variation of Mz2(t) can also be derived from the last line of FIG. 3.

After expiration of the repetition time Tr2, the longitudinal magnetization has reached the value M3, so that $$M3 = Mz2(t = Tr2) \tag{8}$$

The transverse magnetization Mxy occurring after the third r.f. pulse HF3 is calculated as:

$$Mxy = M3 \sin\beta \qquad (9)$$

whilst for the remaining longitudinal magnetization $$Mz = M3 \cos\beta \qquad (10).$$

The longitudinal magnetization again relaxes to the original magnetization Mo in accordance with the relation $$Mz3(t) = M3(\cos\beta + (M_o/M3 - \cos\beta)(1 - e^{-t/T1})) \qquad (11)$$

where t denotes the distance in time from the third r.f. pulse HF3.

After expiration of the repetition time Tr3, the nuclear magnetization Mz3(t) has reached the value Ms. Therefore $$Ms = Mz3(=Tr3) \qquad (12)$$

Subsequently, the next sequence commences, the first r.f. pulse of which is denoted as HF'1. The values Ms, M2 and M3 of the longitudinal magnetization result from the three tomograms, because the values Mxy determined for a pixel in these tomograms according to the equations (1), (5) and (9) are proportional to the values: Ms, M2 and M3 respectively. Moreover because M2, M3 and Ms equal the value Mz1(t), Mz2(t), Mz3(t) at the instants t=Tr1, t=Tr2 and t=Tr3, respectively, only the unknowns $\beta$, Mo and t1 occur in the three equations (3), (7) and (11), so that t1 can thus be determined.

When the flip angle $\beta$ of the r.f. pulses HF1, HF2 etc. is known, only two sub-sequences will be required, resulting in two equations with two unknowns.

The equations can also be iteratively solved. This solution need not be calculated again for each examination and each pixel. Because the two or three values of the nuclear magnetization unambiguously define the value T1, it suffices to calculate these solutions once and to store them in a memory so that when the values determined in the two or three tomograms for a pixel in accordance with the equation (1), (5) and (9) are entered, the associated solution for T1 is fetched.

For the above equations (1) to (12) it has been assumed that the value of the longitudinal magnetization upon occurrence of the echo signal is the same as that upon occurrence of the r.f. pulse. This assumption is at least approximately correct when the distance in time between the gradient echo signals used for generating the tomograms and the preceding r.f. pulses is small in comparison with the longitudinal relaxation time. If, moreover, this distance in time is the same for all sub-sequences, the nuclear magnetization will be subject to the same transverse relaxation until the echo signal, so that transverse relaxation effects or the transverse relaxation time T2 will not have an effect on the determination of the longitudinal relaxation time T1.

For medical diagnostics not only the longitudinal relaxation time T1 is to be known, but often also the transverse relaxation time T2. For the additional determination of T2, at least in one of the sub-sequences, but preferably in all sub-sequences, two 180° pulses or an even number of 180° pulses are generated after the r.f. pulse (H 1 or HF2 etc.), thus enabling the determination of the transverse relaxation time as described in the book "Prinzipien der MR.Tomographie", pages 22, 29, published by Philips Medical Systems. The first 180° pulse generates a spin echo signal which can be detected by means of a suitable read gradient Gx (see second line of FIG. 4). The 180° pulse is situated at the same distance from the preceding r.f. pulse HF1 of the subsequence and the generated spin echo signal. The second 180° pulse, generated after the occurrence of the first spin echo signal produces a second spin echo signal which is positioned in time so that the second 180° pulse is situated exactly halfway between the two spin echo signals.

The first and the second spin echo signals of all sub-sequences comprising 180° pulses are used for generating a respective tomogram. From the different values of the nuclear magnetization resulting therefrom for a pixel the transverse relaxation time constant T2 can be determined, as described with reference to FIG. 5, which represents the transverse magnetization Mxy as a function of the echo time Te for the same pixel value; the echo time is the distance in time between the first r.f. pulse (for example, HF1) and the relevant spin echo signal. Te1 and Te2 are the echo times occurring for each time the first sub-sequence. When the distance in time of the 180° pulses in the other two sub-sequences is chosen to be different (and tomograms are also formed from the spin echo signals produced therefrom), four further measurement points are obtained as denoted by crosses. Because the decrease of the transverse magnetization as a function of time is determined exclusively by the transverse telaxation time, the transverse relaxation time T2 can be simply determined therefrom by exponential adaptation.

Because of the use of the 180° pulses, the variation in time of the longitudinal magnetization as represented by the first line of FIG. 4 is obtained, the polarity of said magnetization being reversed after each 180° pulse. Because the instants at which reversal takes place are known, the longitudinal relaxation time can again be determined therefrom in a manner as described with reference to FIG. 3.

Even though each sequence consists of two or three sub-sequences in the method in accordance with theinvention, the measurement time required for forming the echo signals required for a high-resolution tomogram is comparatively short, because the duration of a sub-sequence is in the range from 30 ms to 100 ms.

I claim:

1. A method in MR tomography of determining magnetization relaxation time in connection with an object disposed in an examination zone where the examination zone is subjected, in the presence of a uniform steady magnetic field, to a plurality of sequences of magnetic energization, each sequence including generating an r.f. pulse for rotating nuclear magnetization in the object through an angle which is smaller than 90°, activating magnetic gradient fields with gradients that are variable from one sequence to another, and detecting spin resonance signals in timed relation with the application of the magnetic gradient fields, wherein each sequence comprises at least two successive sub-sequences, each sub-sequence containing an r.f. pulse for producing echo signals and each sub-sequence having a different repetition time, calculating a respective tomogram from echo signals associated with sub-sequences having the same repetition time, determining a longitudinal relaxation time from the different values of the nuclear magnetization for the same pixel in the tomograms and from the value of the associated repetition time.

2. A method as claimed in claim 1, characterized in that at least one of the sub-sequences contains two 180° pulses, further tomograms being calculated from the spin echo signals produced thereby, the transverse relaxation time (T2) being determined from the different values of the nuclear magnetization of these tomograms and from the time interval between the spin echo signals and the first r.f. pulse (for example, HF1) of the sub-sequence.

3. A method as claimed in claim 2, characterized in that at least two of the sub-sequences contain at least two 180° pulses, the time interval between the two pulses and the first r.f. pulse in the sub-sequences being different.

4. An MR tomography device for determining magnetization relaxation time in connection with an object disposed in an examination zone comprising means for generating a uniform, steady magnetic field, means for generating r.f. pulses in repeating sequences for rotating nuclear magnetization in the object through an angle which is smaller than 90°, each sequence comprising sub-sequences having different repetition times, means for generating at least one magnetic gradient field with a gradient which deviates from one sequence to another, a control unit for controlling the means for generating the r.f. pulses and the means for generating the magnetic gradient field, means for detecting spin resonance signals in timed relation with the application of the magnetic gradient field, and an arithmetic unit for generating tomograms from the spin resonance signals, wherein the arithmetic unit being arranged so that a tomogram is calculated from the echo signals of subsequences having the same repetition time, and a longitudinal relaxation time is determined from the values of the nuclear magnetization for one pixel contained in the tomograms and from the associated repetition time.

* * * * *